United States Patent [19]
Weissmann

[11] Patent Number: 4,482,796
[45] Date of Patent: Nov. 13, 1984

[54] ENERGY-BEAM WELDING MACHINE

[75] Inventor: Klaus Weissmann, Hanau am Main, Fed. Rep. of Germany

[73] Assignee: Leybold-Heraeus GmbH, Cologne, Fed. Rep. of Germany

[21] Appl. No.: 409,388

[22] Filed: Aug. 19, 1982

[30] Foreign Application Priority Data

Aug. 28, 1981 [DE] Fed. Rep. of Germany ....... 3134018

[51] Int. Cl.$^3$ ............................................. B23K 27/00
[52] U.S. Cl. ...................... 219/121 EC; 219/121 EL; 219/121 EN; 219/121 EP
[58] Field of Search ................. 219/121 EC, 121 ED, 219/121 EL, 121 EN, 121 EP, 121 EX, 121 EY, 121 LY

[56] References Cited
U.S. PATENT DOCUMENTS 3,045,608 8/1962 Greene ..................... 219/121 EX X Primary Examiner—C. L. Albritton
Attorney, Agent, or Firm—Felfe & Lynch

[57] ABSTRACT

An energy-beam welding machine has a vacuum chamber consisting of upper and lower parts. For receiving workpieces of various heights, the lower part of the chamber can be lowered to a position below a conveying plane in which the workpieces can be advanced and a lifting column which carries a workpiece-receiving device at its upper end is movable in the vertical direction relative to the lower part of the chamber. The extent of the relative movement can be varied by a displaceable stop between the lifting column and the lower part of the chamber so that, even when the vertical dimensions of the workpieces differ, the position of the welded seams is always in the same plane, and the lower faces of the workpieces can also always be introduced laterally into the lower part of the chamber from the conveying plane.

10 Claims, 3 Drawing Figures

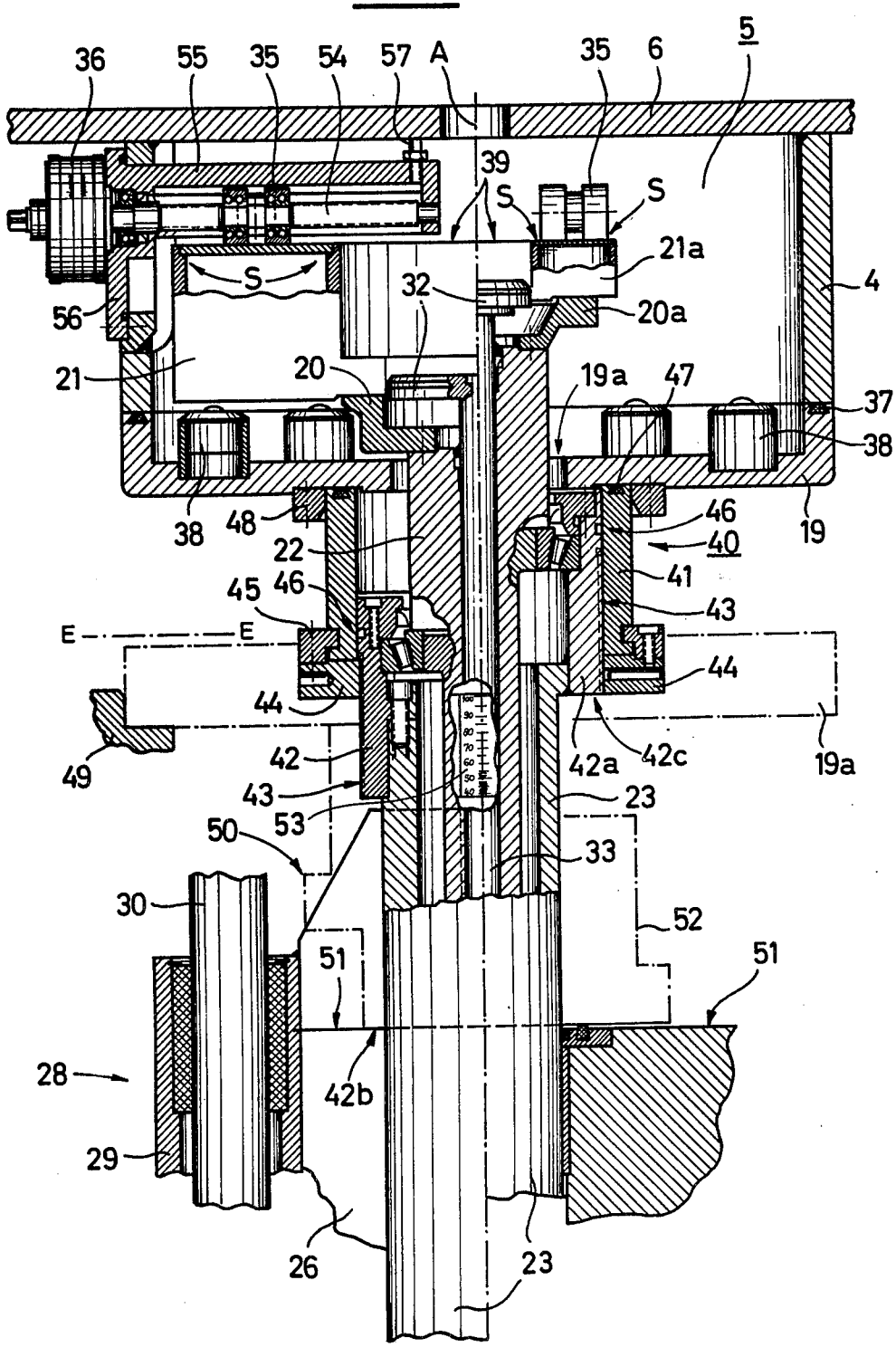

ENERGY-BEAM WELDING MACHINE

The invention concerns an energy-beam welding machine and, more particularly, one having a workpiece-lifting column for welding workpieces of differing heights.

A welding machine wherein an electron beam is used as the energy beam is known from U.S. Pat. No. 4,093,843. In the known welding machine, however, a workpiece lifting column and a lower part of the chamber for the electron beam are rigidly connected to each other, and the workpiece-receiving device in the lifting column is only rotatable relative to the lower part of the chamber. Although the incorporation in this machine of a conveying system for effecting transverse movement would convey the workpieces in the conveying plane, varying heights of the workpieces would weld them at different levels when the vacuum chamber was closed, so that the distance of travel of the energy beam would vary in each case. This would have an undesirable effect upon the results of the welding since electron beams, for example, have a focus, i.e. the narrowest beam cross-section used in the welding, which has a very specific spacing from the source of the beam. Thus, in the case of workpieces of differing heights, a troublesome change in the focusing of the energy beam would have to be carried out, so that the periods required for setting up the welding machine would be unnecessarily extended.

Furthermore, when parts of thin-walled bodies of rotation are to be welded to form hollow bodies by rotating the workpiece-receiving device, it is necessary, in order to avoid distortion due to the welding, to provide a system of hold-down pressure-applying rollers in the upper part of the chamber. Each of these pressure-applying rollers would also have to be adjusted in the vertical direction in dependence upon the vertical dimensions of the workpieces, and this would represent another troublesome and time-consuming step.

Therefore, in order to avoid the need for changing the focusing of the electron beam by maintaining the position, in the vertical, of the seam to be welded in workpieces having different heights, the workpiece-receiving device has been removed each time and replaced for each workpiece of a different height with one that took into account the differing workpiece heights. However, this results in the lower face of the workpiece no longer lying in the conveying plane immediately after being secured to its receiving device, i.e. prior to raising the lower part of the chamber, so that automatic workpiece-feed devices (transverse conveyors) could no longer be used. Thus, manipulators would also have become necessary, and as a rule insufficient space is available for fitting these in view of the constricted conditions in the area surrounding energy-beam welding machines.

In the known energy-beam welding machines, therefore, it was only possible, in the case of workpieces with differing vertical (height) dimensions, either to maintain the position of an upper face of the workpiece to be welded or the lower face of the workpiece in the conveying plane.

In both cases, however, disadvantageously lengthy times for setting up the machine resulted, either from a mechanical point of view because of the need for changing the workpiece-receiving device, or from the electrical point of view on account of the necessity for adjusting or refocusing the energy-beam generator.

The object of the present invention is therefore, to provide an energy-beam welding machine having two, opposite (e.g., upper and lower) linearly-separable vacuum-chamber parts (e.g., the lower part being lowerable) wherein the upper face of each workpiece and therefore the position of the welded seam always lie in the same plane even when the workpieces have differing vertical (height) dimensions from a conveying plane, and wherein, when the workpiece is received from the conveying plane on a receiving device in the machine, its lower face also initially remains in the conveying plane.

According to the invention, in the initially described energy-beam welding machine, this object is achieved in that the lifting column is movable in the linear-separation direction relative to the lower part of the chamber and in that the extent of the relative movement between the lifting column and the lower part of the chamber can be varied by an adjustable stop from the conveying plane for receiving the workpieces to a position setting the place to be welded properly in the machine.

The stated measures enable the workpiece-receiving device—in dependence upon the vertical dimensions of the workpiece—to travel different distances starting from an always similar bottom position and terminating at an adjustable top position, this movement continuing until the upper face of the workpiece and therefore the position of the welded seam come to a stop in the required and always similar end position. Thus, on the one hand, the lower face of the workpiece always lies in the horizontal conveying plane even during its attachment on its receiving device, so that simple transverse movement of the workpieces by means of the usual equipment is possible, and on the other hand the focusing of the energy beam requires no resetting. Also any pressure-applying roller system that may be present does not require to be adjusted, at least not as regards the vertical position.

The lifting column travels completely different distances depending upon the differences in the vertical dimensions of the workpieces, and reliable control of the drive system is possible with the aid of limit switches. However, because of the adjustment of the extent of the relative movement, the lower part of the chamber always executes the same stroke starting from a constant contact below the conveying plane and proceeding until a close seal with the other part of the chamber is established. This is achieved by an initial-adjustable-idling stroke of the lifting column relative to the lower part of the chamber, which idling stroke leads to the required result.

The workpiece-receiving device therefore needs to be replaced only in considerably less frequent cases, namely when the horizontal dimensions of the workpiece have altered to such an extent that it cannot be reliably held by the same receiving device.

The energy beams under consideration are those beams that have a high power density so that local fusing of the material is possible. The beams concerned are electron beams, ion beams, plasma beams, laser beams, etc. However, the subject-matter of the invention is preferably used in the case of electron-beam welding machines.

It is not necessary for the workpiece-receiving device to be rotatable in the lifting column; instead, particularly in the case of workpieces of smaller dimensions, it is possible to deflect the energy beam correspondingly and to guide it over the stationary workpiece in X Y co-ordinates which correspond to the path of the welded seam in a horizontal plane. Combined movements of the workpiece and the energy beam are, of course, also possible.

It is particularly advantageous if the displaceable stop is arranged outside the vacuum chamber. A displacement arrangement of this kind is then easily accessible from the exterior, as compared, for example, with the step involving replacement of a workpiece-receiving device within the vacuum chamber.

An embodiment of a welding machine according to the invention will now be described in greater detail with reference to the accompanying drawings, wherein:

FIG. 3 is an enlarged vertical section through that part of FIGS. 1 and 2 that is of importance to the invention, the vacuum chamber being illustrated in the closed condition.

Figure 1:
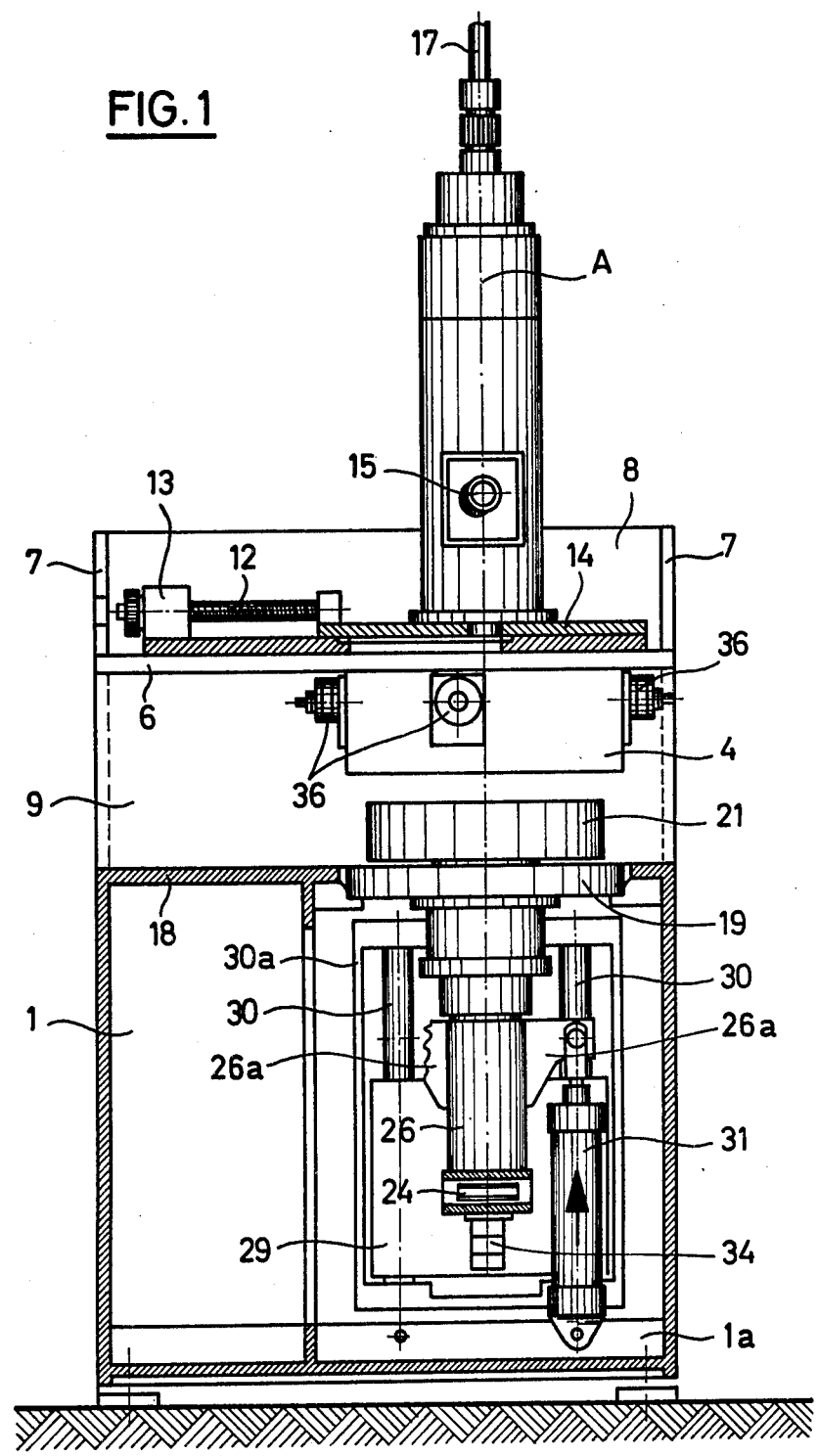
FIG. 1 is a front view of the welding machine with the vacuum chamber open.
Figure 2:
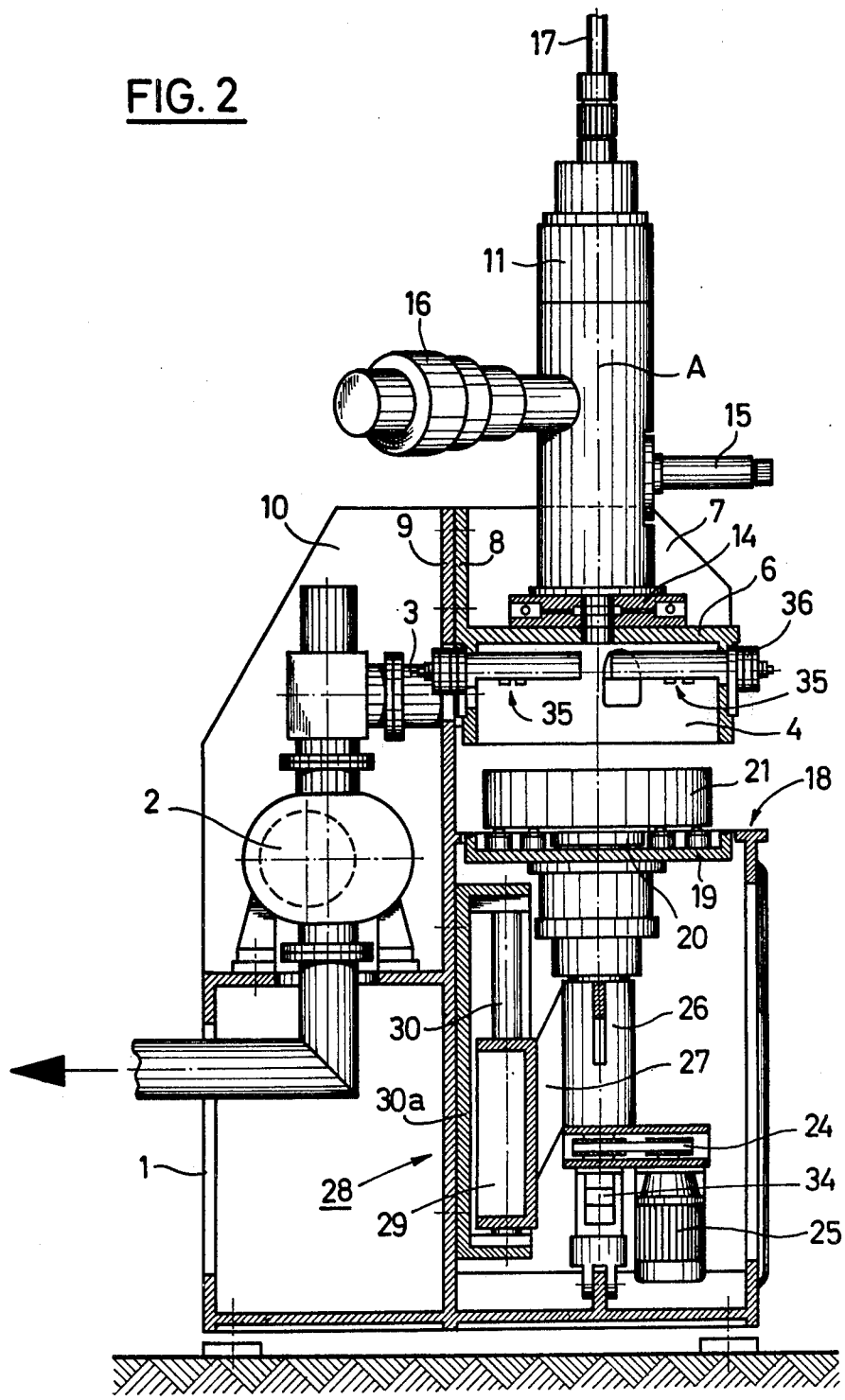
FIG. 2 is a side view of the machine of FIG. 1.

FIGS. 1 and 2 illustrate a machine frame 1 with in side view is roughly C-shaped and on the rear side of which is secured a vacuum pump unit 2 connected by a suction pipe 3 to the upper part 4 of a vacuum chamber 5 (FIG. 3). The upper part 4 of the chamber has a cover 6 which is wider than the vacuum chamber 5 and is connected by two lateral support cheeks 7 to a flange plate 8 attached to a vertical wall 9 of a rear portion 10 of the machine frame 1. The cover 6 of the chamber thus forms a projecting bracket. Arranged on the cover 6 of the chamber is an energy-beam generator 11, which may be designed as an electron-beam gun. As shown in particular in FIG. 1, the energy-beam generator 11 is movable in the transverse direction on the cover 6 of the chamber by means of a screw-threaded spindle 12 and a displacement drive 13. For this purpose, the beam generator 11 is secured on a carriage 14 which, opposite the cover 6 of the chamber, has a roller guide, not shown in detail and illustrated very diagrammatically in FIG. 2. The displacement drive 13 serves to adjust the position of the beam generator 11 to suit various diameters of workpiece. The axis of the system, which coincides with the axis of the beam generator and that of the lifting column to be described in detail below, is designated by the letter A.

Also associated with the energy-beam generator 11 are a viewing means 15 and a vacuum pump 16 which, however, form part of the prior art. The beam generator is supplied with current through a high-voltage cable 17.

Associated with the machine frame 1 is a table 18 in which is arranged a movable lower part 19 of the chamber. Arranged in this lower part is a workpiece-receiving device 20 on which is secured a workpiece 21, for example a hollow body of rotation for the production of a vibration damper on the upwardly directed end-face of which the welding operations are to be carried out.

In the manner shown in detail in FIG. 3, the workpiece-receiving device 20 is secured at the upper end of a shaft 22 which is mounted to rotate in a lifting column 23. The lower end of the shaft 22 projects from the lifting column and is connected by a drive belt 24 to a geared motor 25. By rotating the workpiece-receiving device 20 by means of the geared motor 25, circumferential welds can be made on the workpiece in the known manner.

The lifting column 23 (FIG. 3) is mounted for vertical movement in a housing 26 which is connected by an arm 27 to a vertical guide 28 consisting of a slide 29 and two vertical guide columns 30. For driving the housing 26 and therefore the lifting column 23, use is made of two symmetrically arranged pressure-medium cylinders 31, only one of which, i.e. the right-hand cylinder is illustrated in FIG. 1. The piston rods of the cylinders 31 are secured to lateral arms 26a whereas the lower ends of the cylinders are connected by a cross-beam 1a associated with the machine frame 1. Arranged within the workpiece-receiving device 20 is a centering means 32 which is connected by an actuating rod 33 to a centering drive 34 which is mounted on the housing 26. The top and bottom of each guide column 30 are secured in a frame 30a which is bolted onto the machine frame 1.

Equidistantly arranged on the periphery of the upper part 4 of the chamber are four pairs of pressure-applying rollers 35 which are radially displaceable by displacement means 36. Reference is again made to FIG. 3 as regards details.

As can be seen from FIG. 3, the upper part 4 of the chamber has a cylindrical body the lower end face of which abuts the upper end-face of the lower part 19 of the chamber, a seal 37 being interposed between said two parts. In this way, a substantially cylindrical vacuum chamber 5 is formed.

Provided on the base of the lower part 19 of the chamber are a plurality of conveying rollers 38, the uppermost points of which lie in a common plane. Also, a central bore 19a through which the shaft 22 extends into the vacuum chamber 5, is formed in the base of the lower part 19 of the chamber. The shaft 22 is regarded as being a part of the lifting column 23 in which it is mounted so as to be undisplaceable in the axial direction, so that this meets the requirement that the lifting column projects into the vacuum chamber. The upper part of the shaft 22 forms an extension of the lifting column 23.

The halves of FIG. 3 that lie to the left and right of the axis A of the system differ from each other in the following way:

Illustrated in the left-hand half is a workpiece 21 which has the largest possible dimensions that the welding machine in question is able to handle. Provided for this workpiece is a receiving device 20 which is in the bottom position. The positions of the shaft 22, the lifting column 23 and the centering means 32 also correspond to this bottom position.

Illustrated in the right-hand half of FIG. 3 is a workpiece 21a having considerably smaller vertical dimensions as well as a smaller outside diameter. A receiving device 20a is provided for this wokpiece. At their upper sides the two workpieces have circumferential separating faces which are to be interconnected by welded seams S. Since it is necessary to meet the requirement that the upper faces 39 and therefore the welded seams of the two workpieces lie in the same plane, this being illustrated by the same vertical positions of the pressure-applying rollers 35, the workpiece-receiving device 30a is in a considerably higher position than that shown in the left-hand half of FIG. 3. The difference in the levels corresponds precisely with the difference in the vertical dimensions of the two workpieces. The positions of the shaft 22, the lifting column 23 and the centering means 32 correspond to the position of the workpiece-receiving device 20a.

However, as shown in FIG. 3, the lower part 19 of the chamber occupies the same position in both cases, in which position said lower part is connected to the upper part 4 of the chamber in a vacuum tight manner. This occurs because of the presence of a displaceable stop 40 which is formed by a spacing sleeve 41 axially displaceable relative to the lifting column 23. A screw-threaded head 42, 42a, is secured on the lifting column for the purpose of displacing the spacing sleeve 41. The illustrations of the screw-threaded head to the left and to the right in FIG. 3 differ from each other only in that the screw-threaded head 42 is screwed to the lifting column 23, whereas the screw-threaded head 42a is welded to the lifting column 23. The outer dimensions are identical however, and in both cases a screw-threaded head is provided with an external thread 43 over a substantial portion of its length. The internal thread of a screw-threaded ring 44, which is rotatably mounted on the spacing sleeve 41 by means of a flanged ring 45, engages in the external screw-thread 43. Furthermore, the spacing sleeve 41 is longitudinally displaceable relative to the screw-threaded head, and a vacuum seal 46 is arranged between these two parts. In this way, the position of the spacing sleeve 41 in relation to the lifting column 23 can be infinitely adjusted by rotating the screw-threaded ring 44. The upper end-face of the spacing sleeve 41 is provided with a further vacuum seal 47 and lies within a centering ring 48 mounted on the lower part 19 of the chamber and bevelled at its inner edge.

It will be appreciated that when the lifting column 23 is lowered, the lower part 19 of the chamber follows it immediately until it reaches the position 19a, shown in broken lines, in which position it comes to a stop against a support 49. In this position 19a, the load-bearing zones of the conveying rollers 38 lie immediately below the conveying plane E—E which is illustrated in the left-hand half of FIG. 3. The lifting column 23 and the workpiece-receiving device 20 cannot move further downwards from this position, since the spacing sleeve 41 and the screw-threaded head 42 are in a position which is illustrated by the broken contour line 50. In this position, the lower end-face 42b of the screw-threaded head 42 rests on a support surface 51 which is connected to the machine frame 1. The workpiece 20 can be moved laterally from this position by way of the rollers 38 and further rollers which are not illustrated but are located on the table 18, and the workpiece can be replaced by a fresh (large) workpiece 20.

The situation is different in the right-hand half of FIG. 3. Here, upon the lower part 19 of the chamber reaching the position 19a the lifting cylinder 23 has not yet completed its full stroke and reached its end position. Since, at this moment, the lower end face 42c of the screw-threaded head 42a is still at a considerable distance above the support surface 51, the lifting column 23 can still be lowered to a corresponding extent until the lower end-face 42c comes to a stop against the support surface 51. Since the screw-threaded ring 44 then occupies its bottom position, this ring also rests on the support surface 51. The parts concerned lie within the contour line 52.

Because of this further downward movement, the workpiece-receiving device 20a together with the workpiece 21 executes a further downward movement relative to the lower part 19 of the chamber until the lower face of the workpiece 21 reaches the same horizontal plane as does the lower face of the workpiece 21 in the left-hand of FIG. 3. In this position too, the load-bearing zones of the rollers 38 lie immediately below the conveying zone E—E and the (smaller) workpiece 21a can be discharged in the transverse direction by way of the rollers without any appreciable change in the vertical position.

It follows that the total stroke of the lifting column 23 in the case illustrated on the right is greater than in that illustrated on the left. Assuming that the difference in the vertical dimensions of the workpieces 21 and 21a is 65 mm, then the stroke of the lifting column in the case illustrated on the right is greater by precisely this amount of 65 mm, than in the case illustrated on the left. Irrespective of this, however, the stroke of the lower part 19 of the chamber remains the same.

In the reverse procedure, i.e. when the vacuum chamber 5 is loaded for the purpose of carrying out a further welding operation, the following takes place: whereas in the case illustrated on the left, the lower part 19 of the chamber and the lifting column 23, together with the workpiece 21, are moved upward simultaneously from the start and this common movement continues until the pressure-applying rollers 35 are engaged, in the case illustrated on the right the lifting column 23 with the spacing sleeve 41 located further down moves initially without entraining the lower part 19 of the chamber, since between the latter and the vacuum seal 47 there is initially still a space which corresponds to the difference in the vertical dimensions of the workpieces. However, the workpiece-receiving device 20a moves to a corresponding extent into the interior of the vacuum chamber which is initially not yet closed. After this "idling stroke" has been completed, i.e. after the vacuum seal 47 has moved into contact with the lower part 19 of the chamber, this part is entrained by the lifting column 23 by way of the spacing sleeve 41 and, on completion of the stroke, likewise moves into contact with the lower end-face of the upper part 4 of the chamber. The vacuum chamber 5 is then closed, but the workpiece-receiving device 20a is in a considerably higher position, in which the (smaller) workpiece 21a has also moved into contact with the pressure-applying rollers 35.

The apparatus can be operated considerably more easily if a graduated scale 53 is attached to the screw-threaded head 42; 42a, which scale can be provided for example by means of a flat milled-out zone in the outer thread 43 of the screw-threaded head. In this case, the lower edge of the screw-threaded ring 44 can serve as a mark which can be brought into register with the various marks forming the scale. If the scale 53 is calibrated in units for measuring the height of the workpieces, the device can be readily set to the corresponding height of workpiece, so that the machine can be operated without any complicated measurements or other steps.

FIG. 3 also shows how the pressure-applying rollers 35 can be displaced radially in relation to the axis A of the lifting column 23. The pressure-applying rollers 35 are arranged on radially directed screw-threaded spindles 54 which are mounted in removable spindle housings 55. The spindle housings 55 are fitted in the body of the upper part 4 of the chamber by means of a flanged plate 56, and at the opposite end they are braced against the cover 6 of the chamber by a set screw 57. The screw-threaded spindle 54 can be caused to rotate by means of the displacement device 36, so that the pressure-applying rollers 57 can be displaced in the radial direction. In this way the device can be easily set to suit various diameters of workpiece. The portion of the workpiece 21; 21a that is to be welded in is safely retained by the pressure-applying rollers so that perfect welds are possible.

I claim:

1. In an energy-beam welding machine having means for welding workpieces with the energy beam in a vacuum chamber for receiving the workpieces, the vacuum chamber having opposite, linearly-separable parts of which at least one is adapted to be so linearly separated from the other, for charging the workpieces, to a position spaced from a conveying plane in which the workpieces can be advanced transversely to the linear separation of the parts for the charging, the improvement comprising:

a lifting column in the one part of the vacuum chamber, a workpiece-receiving device carried on one end of the lifting column for receiving the workpieces so conveyed for the charging, means for moving the lifting column in the linear separation direction relative to the one part of the chamber, and adjustable stop means for varying the extent of the relative movement of the lifting column.

2. An energy-beam welding machine according to claim 1, wherein the adjustable stop means is disposed outside the vacuum chamber.

3. An energy-beam welding machine according to claim 2, wherein the adjustable stop means includes a spacing sleeve axially displaceable relative to the lifting column and having an end face which, after executing a presettable stroke, makes driving contact with the one part of the chamber.

4. An energy-beam welding machine according to claim 3, wherein a screw-threaded head is secured on the lifting column and a screw-threaded ring on the head and a spacing sleeve is mounted on the head for axial adjustment relative to the head by the screw-threaded ring.

5. An energy-beam welding machine according to claim 4, and further comprising a first vacuum seal arranged between the screw-threaded head and the spacing sleeve, and a second vacuum seal located at an end of the spacing sleeve for contacting a face of the one part of the chamber.

6. An energy-beam welding machine according to claim 4, including a graduated scale attached to the screw-threaded head and readable against the screw-threaded ring, the scale being calibrated in units for measuring the height of the workpiece.

7. An energy-beam welding machine according to claim 1, wherein the one part of the chamber comprises conveying rollers the load-bearing points of which lie in the conveying plane when the parts of the chamber are spaced.

8. An energy-beam welding machine according to claim 1, wherein the other part of the chamber comprises at least one pressure-applying roller for engaging the workpiece, and wherein the workpiece-receiving device is rotatable in the vacuum chamber.

9. An energy-beam welding machine according to claim 8, wherein the pressure-applying roller is displaceable in the radial direction towards the axis of the lifting column.

10. An energy-beam welding machine according to claim 1, wherein the workpiece-receiving device is arranged to hold axially symmetrical workpieces, and a centering device for the workpieces is arranged in the lifting column.

* * * * *